United States Patent [19]
Nichols et al.

[11] Patent Number: 5,319,569
[45] Date of Patent: Jun. 7, 1994

[54] BLOCK AVERAGING OF TIME VARYING SIGNAL ATTRIBUTE MEASUREMENTS

[75] Inventors: Douglas C. Nichols, Saratoga; Paul S. Stephenson, Pleasanton; John S. Schmitz, Sunnyvale, all of Calif.

[73] Assignee: Hewlett-Packard Company, Palo Alto, Calif.

[21] Appl. No.: 878,104

[22] Filed: May 4, 1992

Related U.S. Application Data

[63] Continuation-in-part of Ser. No. 777,456, Oct. 16, 1991, abandoned, which is a continuation-in-part of Ser. No. 409,471, Sep. 19, 1989, abandoned.

[51] Int. Cl.$^5$ .............................................. G06F 15/20
[52] U.S. Cl. .................................. 364/487; 324/76.12; 324/76.15; 324/76.24; 364/550
[58] Field of Search ............... 324/76.12, 76.15, 76.24; 364/487, 550

[56] References Cited

U.S. PATENT DOCUMENTS

| | | | |
|---|---|---|---|
| 2,970,261 | 1/1961 | Zoll ................................ | 364/487 X |
| 3,980,953 | 9/1976 | Nance et al. ..................... | 370/79 X |
| 4,468,614 | 8/1984 | Takahashi et al. ............. | 324/76.24 X |
| 4,680,540 | 7/1987 | Niki et al. ....................... | 324/76.39 |
| 4,843,309 | 6/1989 | Kareem et al. ................. | 340/722 X |
| 5,243,537 | 9/1993 | Neumann ....................... | 364/487 |

Primary Examiner—Edward R. Cosimano

[57] ABSTRACT

A method and apparatus for block averaging measurement data from dynamic, repeating input signals, for example, frequency modulated signals, take into account the time variability of the measurement sampling. Each block of measurement data is referenced to a synchronizing stimulus, and measurements are averaged both on the time axis and on the modulation axis. On the time axis, the time alignment for each individual measurement is placed at the center of the time interval during which the measurement was made. For each block of data acquired, the measurement blocks are averaged together in both dimensions, time (x-axis) and modulation (y-axis result being computed), using a stimulus synchronizing signal provided by the user as a time reference (time=0). The stimulus synchronizing signal should be a stable reference with respect to the modulation function being measured. For example, if frequency versus time is being measured, the reference should identify a repeating frequency reference. The times from the stimulus synchronizing reference to the input signal events are measured and accounted for in the block averaging method of the invention.

8 Claims, 8 Drawing Sheets

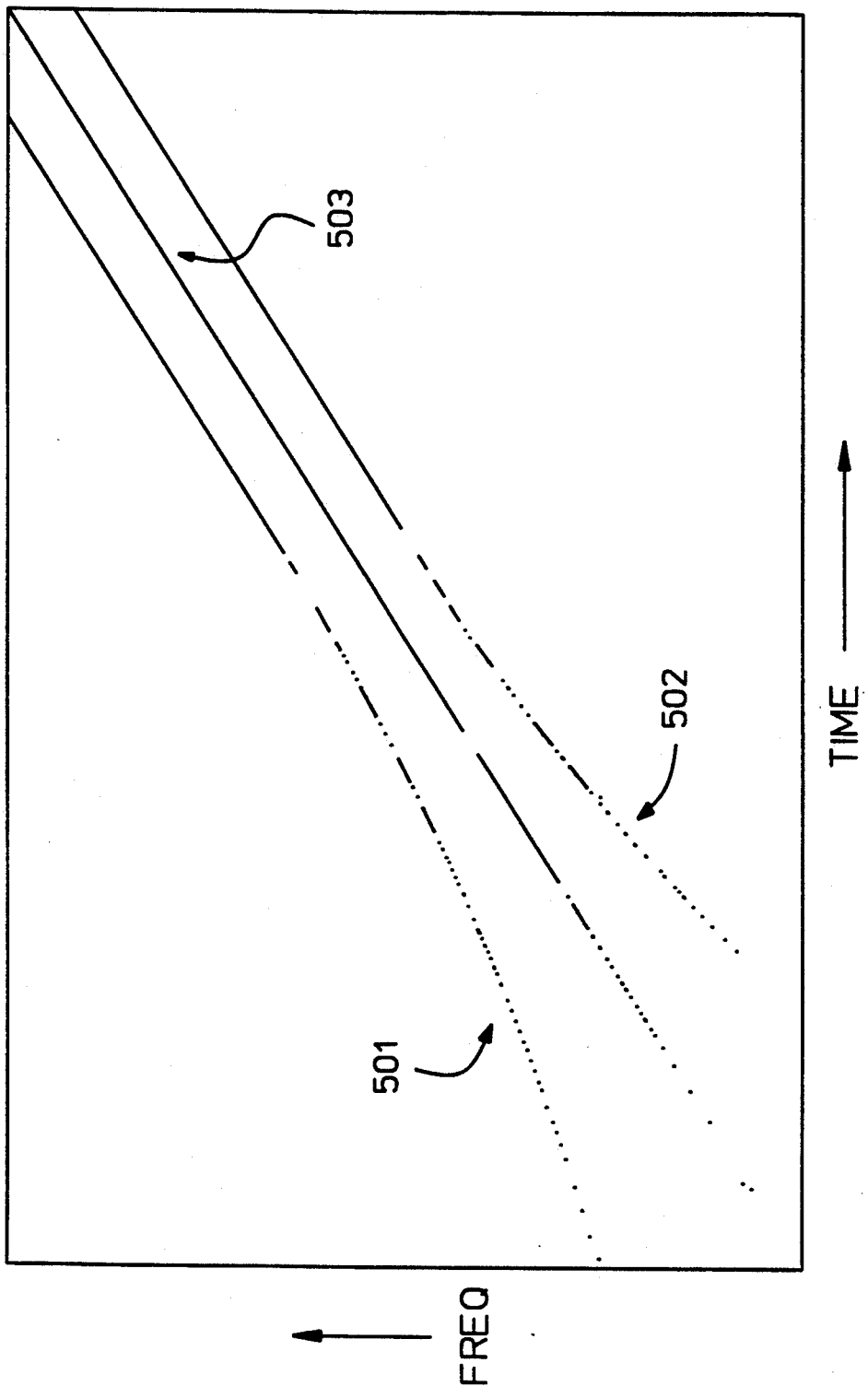

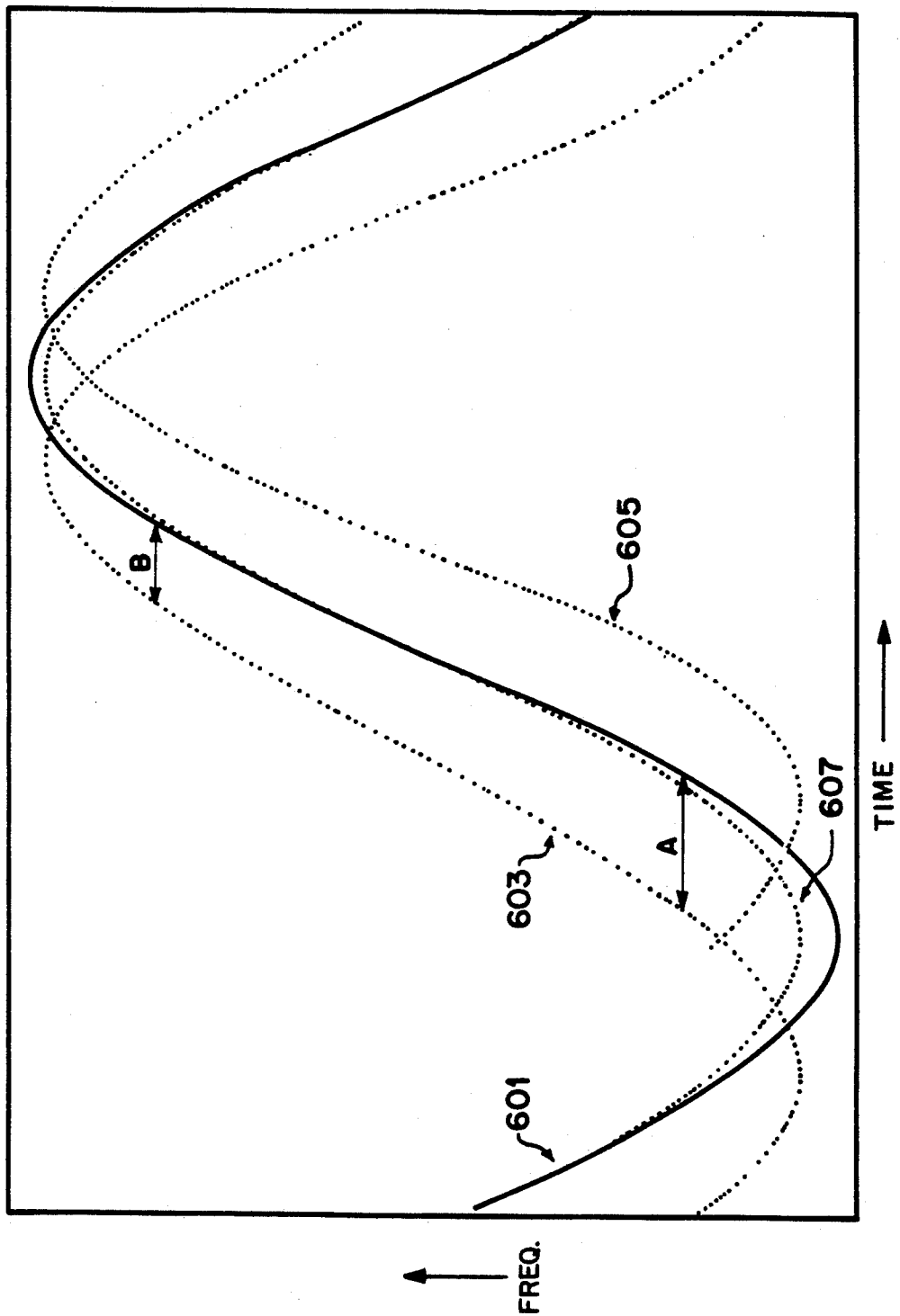

BLOCK AVERAGING OF TIME VARYING SIGNAL ATTRIBUTE MEASUREMENTS

CROSS-REFERENCE TO RELATED APPLICATIONS

This is a continuation-in-part of U.S. patent application Ser. No. 07/777,456, filed on Oct. 16, 1991, entitled "BLOCK AVERAGING OF TIME VARYING SIGNAL ATTRIBUTE MEASUREMENTS," in the names of Douglas C. Nichols, Paul S. Stephenson, and John S. Schmitz, now abandoned which is a continuation of U.S. patent application Ser. No. 7/409,471, filed on Sep. 19, 1989, now abandoned, having the same title and filed in the same names, and all assigned to the same assignee.

Field of the Invention

This invention relates generally to averaging signal attribute measurement data, and in particular to time averaging attribute measurement data of time varying signals. One application of the invention is to accurately average frequency versus time measurements for a signal with dynamic frequency.

BACKGROUND OF THE INVENTION

Averaging is a well-known approach to reduce the effect of noise on signal measurements. Averaging is a technique that can be used to reduce the impact of an unstable or random-like process that is present on an otherwise stable process. Averaging reveals the stable portion of the process by diminishing the contribution of the unstable process as the average progresses. For example, a frequency counter might average a number of measurements on a constant frequency signal to improve the resolution of the measurement.

Generally, to analyze the behavior of a signal over a period of time, a block of time-related measurements is taken. A display of amplitude measurements versus time will produce a waveform of the signal's behavior.

For repetitive signals, block averaging of the corresponding samples from successive measurement blocks will improve the resolution of the measurement. Amplitude block averaging methods are found on some digitizing sampling oscilloscopes (DSO).

The general approach to averaging signal amplitude versus time requires triggering each waveform block from a reference signal. If this reference provides an unambiguous voltage that identifies a time with respect to which the amplitude characteristics of the measured signal are repeating, then block averaging can be used to obtain improved amplitude resolution. This type of averaging is essentially one-dimensional: the y-axis values (voltage amplitude) of each update are averaged, but the x-axis values (time position) remain constant.

Additionally, continuous time interval measurements on a signal provide an approach to analyze characteristics of the signal in the modulation domain, i.e., the behavior of the frequency or phase of the signal versus time. This is different from classical ways of measuring and displaying data about signals. An oscilloscope shows amplitude versus time: the time domain. A spectrum analyzer shows amplitude versus frequency: the frequency domain. These continuous time interval measurements make it easier to study dynamic frequency behavior of a signal, for example, frequency drift over time of an oscillator, the frequency hopping performance of an agile transmitter, chirp linearity, and phase switching in radar systems.

An example of an instrument that makes continuous time interval measurements and generates data referred to as "time stamp" data is described in "Frequency and Time Interval Analyzer Measurement Hardware," Paul S. Stephenson, Hewlett-Packard Journal, Vol. 40, No. 1, February, 1989. Time stamp data comprises an event count and a time count for each measurement sample taken. The instrument disclosed by Stephenson includes measurement hardware that counts input signal cycle events and counts clock cycles from an internal clock, memory to store the measurement data, and a microprocessor for controlling the operation of the instrument and processing the measurement data.

The measurement data to be averaged comprises data taken by a measurement instrument, such as the frequency and time interval analyzer instrument described by Stephenson, above. Typically, the data is stored for processing after data acquisition has been completed. FIG. 1 shows a system block diagram of the instrument described by Stephenson. An input signal to be measured is applied to input amplifier 703 via input line 702. The input amplifier 703 preconditions the signal and converts it to binary form for input to the measurement hardware 701 via line 704. Measurement hardware 701 receives measurement setup and control instructions from the microprocessor 705 via line 706. Measurement hardware 701 acquires the measurement data from the input signal and stores the data in memory 707. The raw binary data acquired and stored by the measurement hardware 701 is provided to microprocessor 705 via line 706 for processing, either for display or for storage.

Now, block averaging is important for analyzing dynamic, repeating inputs, that are changing with time but eventually repeat in such a way that there is a stimulus to synchronize with repetition. VCO testing provides an example of this class of input. The applied voltage tuning step provides the synchronization that allows the measurement instrument to repetitively capture the frequency response.

However, the input may not be phase-coherent with respect to the synchronizing stimulus. Stated simply, phase coherence means that the measured input would be at the same phase every time the stimulus is applied. For the VCO example, if the VCO output were always at 90 degrees (maximum high voltage) when the tuning step was applied, it would be phase-coherent. Notice that phase coherence has nothing to do with the repeatability of the frequency at a given time. The VCO might have an arbitrary phase when the tuning step is applied, but it might also always be at 52.35 MHz at the time of the step. The lack of phase coherence introduces time variabilities in continuous time interval measurements that conventional block averaging methods have not been able to handle.

SUMMARY OF THE INVENTION

One embodiment of the invention provides a method and apparatus for block averaging measurement data from dynamic, repeating input signals, for example, frequency modulated signals, taking into account the time variability of the measurement sampling. Each block of measurement data is referenced to a synchronizing stimulus, and measurements are averaged both on the modulation axis and on the time axis. On the time axis, the time alignment for each individual measurement is placed at the center of the time interval during which the measurement was made. That is, time alignment for each individual measurement is placed in the center of the interval being measured. With each block update, these centered times are averaged together.

For each block of measurement data acquired, the measurement blocks are averaged together in both dimensions, time (x-axis) and modulation (y-axis result being computed), using a stimulus synchronizing signal provided by the user as a time reference (time=0). The stimulus synchronizing signal should be a stable reference with respect to the modulation function being measured. For example, if frequency versus time is being measured, the reference should identify a repeating frequency reference. The times from the stimulus synchronizing reference to the input signal events are measured and accounted for in the averaging method of the invention.

Thus, the averaging method of the invention is two-dimensional, accounting for both y-axis changes (modulation axis) and x-axis changes (time axis), when averaging derived modulation parameters. Therefore, the method and apparatus correctly average repetitive signals that lack phase coherence, and provides improved resolution of frequency, period, time interval, and phase versus time measurements. The measurement data averaging method of the present invention can be carried out by any suitable processor, such as the microprocessor included in the instrument described by Stephenson. That is, the block averaging method of the present invention is one form of processing that the microprocessor 705 can perform on the raw binary measurement data stored by the measurement hardware 701 in the memory 707.

BRIEF DESCRIPTION OF THE DRAWINGS

FIG. 7 illustrates the effect of time placement error for a linearly modulated input signal.

FIG. 8 shows a signal with sinusoidal frequency modulation and the result of acquiring multiple time interval data block updates of this signal.

DETAILED DESCRIPTION OF THE PREFERRED EMBODIMENTS

With block averaging, the corresponding samples from successive measurement blocks are averaged together, which produces a block of averaged results. The objective for block averaging is to obtain greater resolution that can be provided from an individual measurement.

The inventor had determined that it is unacceptable for many types of frequency varying signals to simply average the corresponding measurement samples from successive blocks. In fact, there are several important issues that need to be considered and dealt with before a form of block averaging that actually does provide enhanced resolution can be realized.

One might suppose that a reasonable way to perform block averaging would be to take all the first measurements from each block and average them, take all the second measurements from each block and average them, and so on. If a frequency measurement were being performed, the result from block averaging would be the same size as each individual block, with each value being the average frequency of all measurements that appeared in the same position of each block.

Figure 2:
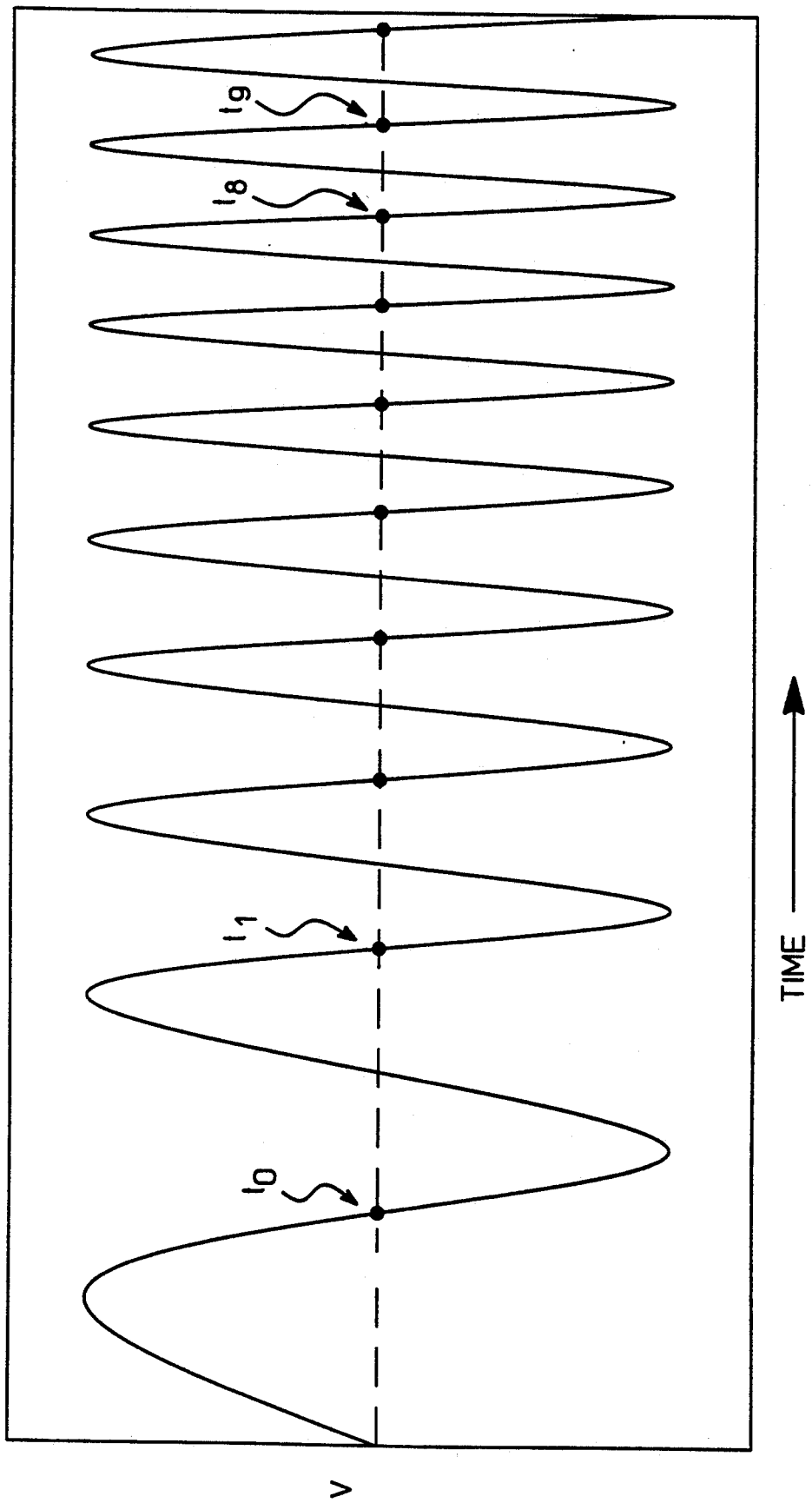
FIG. 2 shows an example of sampling on a signal with linear frequency modulation.

Consider using this method on a signal with linear frequency modulation, starting from an arbitrary base frequency and exhibiting arbitrary phase upon each update (phase non-coherence is the most general and probably most common situation). One occurrence of such a signal is shown in FIG. 2. For all the examples discussed, a negative slope crossing will be the detected event. The zero crossings $t_0$, $t_1$, $t_8$, and $t_9$ are labelled in FIG. 2.

Figure 3:
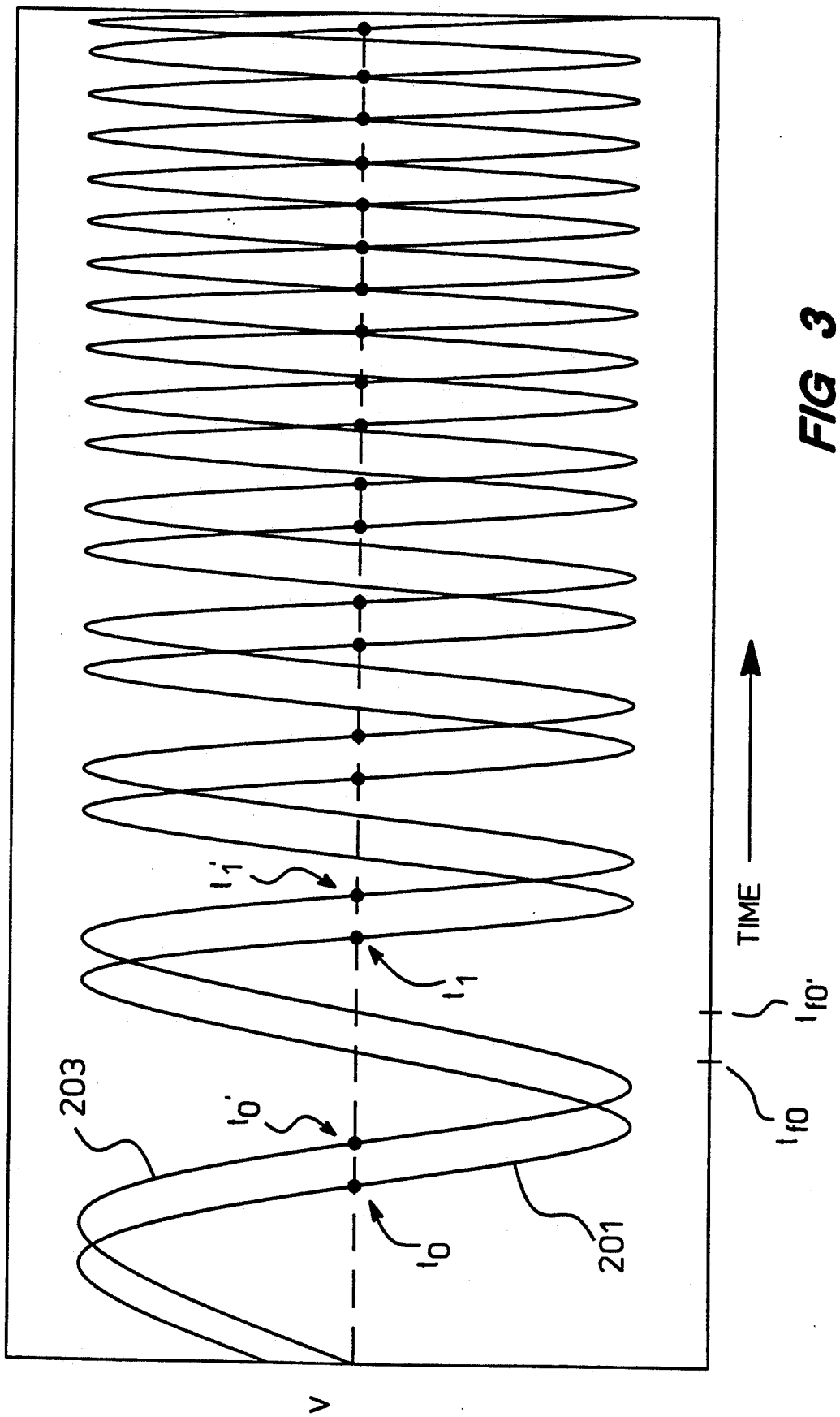
FIG. 3 shows two possible occurrences of the linear frequency modulation signal of FIG. 2, with varying starting phase.

FIG. 3 shows two possible occurrences of the linear frequency modulation signal, waveform 201 and waveform 203. The first two zero crossings for waveform 201 are labelled $t_0$, $t_1$, and the first two zero crossings for waveform 203 are labelled $t_0'$, $t_1'$. Because the starting phase is arbitrary, the times of the events on each waveform are different. However, the frequencies of the two waveforms are identical at all times.

Since the time alignment of the events from each waveform in FIG. 3 is different, it is easy to see that combining the frequency results from each waveform, without taking into account the event timing differences, is not going to produce a useful result. To state it another way, the frequencies obtained by computing $1/(t_1-t_0)$ or $1/(t_1'-t_0')$ for each waveform cannot be simply combined and averaged because each frequency measurement covers a different time span. Even disregarding the first event measurement of a fractional period does not help. Successive measurements of the frequency do not line up because they are made at different times, and the frequency is changing over time.

Figure 4:
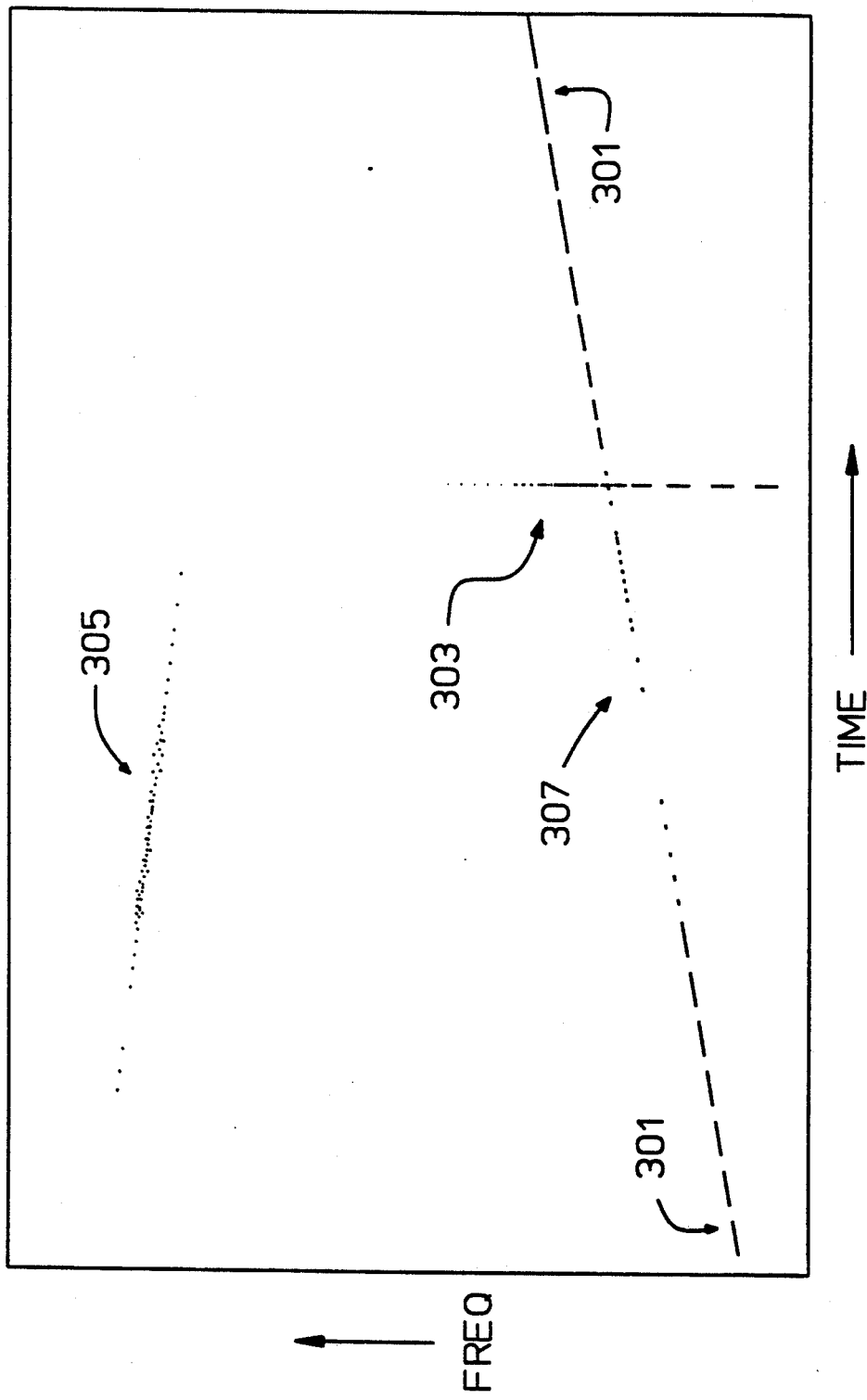
FIG. 4 is a frequency versus time plot showing the result of using various averaging methods on continuous time interval data from a signal with linear frequency modulation.

FIG. 4 is a plot of frequency versus time showing the result of using various averaging methods on continuous time interval data from a signal with linear frequency modulation. The actual modulation is indicated on FIG. 4 by the dashed line segments 301 appearing near the bottom left margin and slightly higher on the right margin. This line is actually continuous, but the center portion has been removed to more clearly show data points 307.

The result of using a simple block averaging method on a linearly modulated input is shown as data points 303 on FIG. 4. The vertical line of data points 303 on FIG. 4 shows the progression of the average with successive block updates. Although the order of the progression is not apparent from the figure, it is clearly undesirable that the progression is restricted to move only along a vertical line. As the number of updates progresses, the average result does not tend to converge on the dashed line representing the actual modulation. The problem is that it ignores the fact that each measurement is a time-dependent frequency value.

The data points 305 on FIG. 4 show the result of attempting to build an average from consecutive updates using first sample time alignment. The plot demonstrates the fundamental problem: the first sample in the block is not a meaningful time reference to anything other than the block that it is a part of.

An alternative might be using the first zero crossing to define time=0. To see what would happen using the first measurement as a reference, the linear modulation example was used to test the following averaging algorithm:

$$\hat{y} = (1/N)\left\{ \sum_{k=1}^{N} y_{1,k}, \sum_{k=1}^{N} y_{2,k}, \ldots, \sum_{k=1}^{N} y_{M,k} \right\} \quad (1)$$

$$\hat{x} = (1/N)\left\{ 0, \sum_{k=1}^{N} x_{1,k}, \sum_{k=1}^{N} x_{2,k}, \ldots, \sum_{k=1}^{N} x_{M,k} \right\} \quad (2)$$

Figure 5:
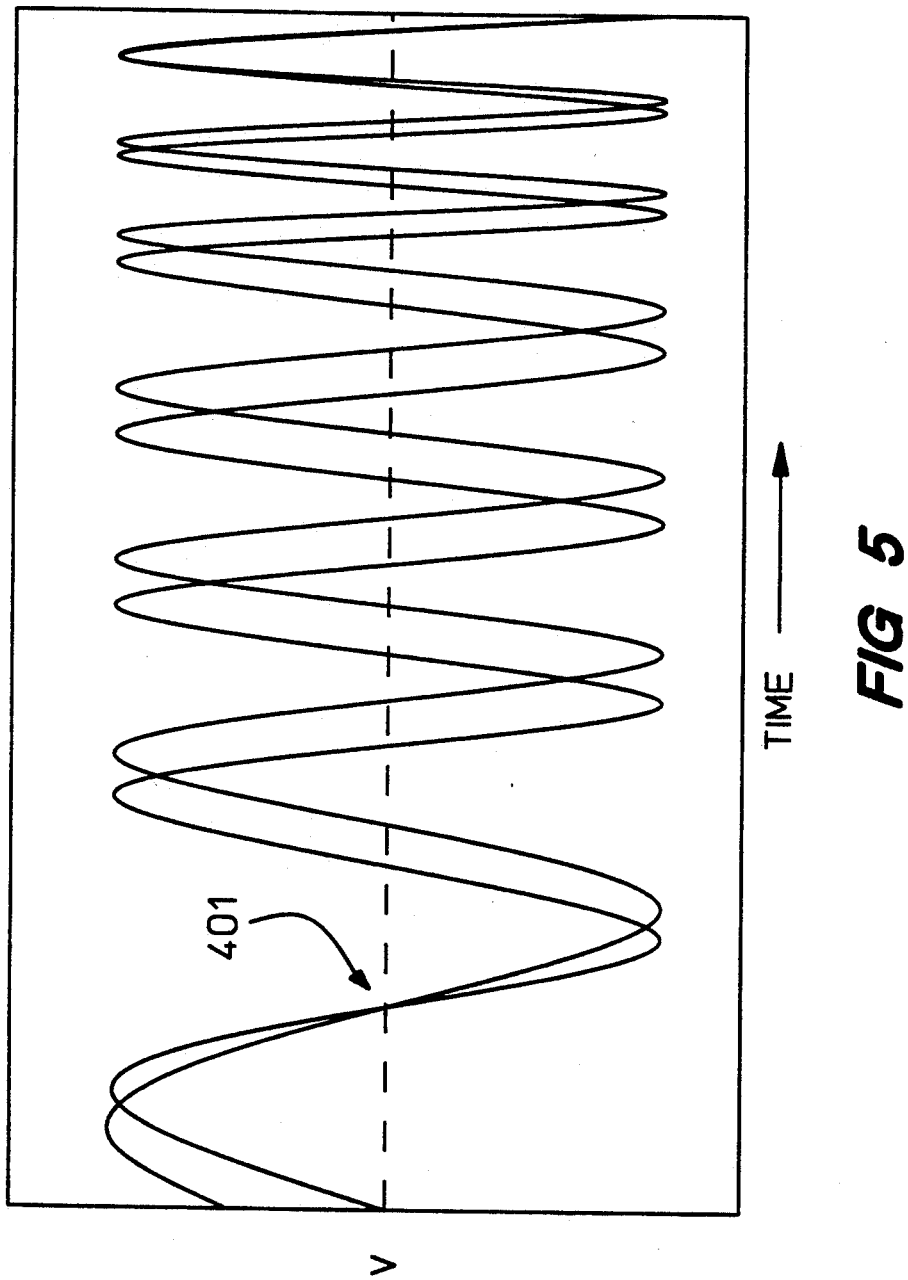
FIG. 5 shows the same signal occurrences shown in FIG. 3, but time-aligned by the first zero crossing.

The $\hat{x}$ is used to indicate an average. M is the number of samples per block. Notice that the first value of the $\hat{x}$ result is set to 0 (the time reference) and that all other x-average values subtract off the actual measured time value of the first measurement so that they are correctly time-related to this reference. FIG. 5 shows the same two blocks that were shown in FIG. 3. The difference is that FIG. 3 showed them properly aligned with respect to each other as they actually occurred (the modulation is the same on both at all times), while FIG. 5 shows them aligned by the first zero crossing 401 to demonstrate that they would be incorrectly aligned using the first zero crossing to define time=0.

From the prior discussion, it is apparent that successive block updates must be combined using a method that considers the fact that the times of the zero-crossing events for each measurement block are different. What this amounts to is that a common time reference between the blocks must be found. What is meant by a common time reference is a time value (perhaps unique for each block) whose relationship to the frequency modulation of that block is fixed.

The method of the invention provides a new type of block averaging that references the measurement block to the synchronizing stimulus, e.g., the arming edge, rather than to the first measurement sample. This is precisely what is required to properly time-relate multiple time interval measurement data blocks of a repetitively modulated input signal. The arming edge must have a stable relationship to the modulation on the input signal.

This reference requirement allows alignment of modulation versus time for successive blocks of measurement data. The measurement data points 307 in FIG. 4 show the progression of averages for a single data point using the block arming reference as time=0 for each block in accordance with the method of the invention. For example, the reference edge might be the voltage tuning step for a VCO and the measured signal the VCO output.

Using the block arming edge as the time reference (time=0) for each block that is acquired in accordance with the method of the invention, the blocks are averaged together in both dimensions, time (x-axis) and f(t) (y-axis result being computed). The f(t) average results are given by:

$$(1/N)\left\{ \sum_{k=1}^{N} f(x_{1,k}), \sum_{k=1}^{N} f(x_{2,k}), \ldots, \sum_{k=1}^{N} f(x_{M,k}) \right\} \quad (3)$$

where:
N=the number of measurement blocks;
M=the number of samples per block; and
$f(x_{i,k})$=the measured value for the ith sample measurement in the kth block.

For the time axis, time alignment for each individual measurement is placed such that it falls in the center of the interval being measured. With each block update, these centered times are averaged together. The time-axis average waveform is given by:

$$(1/N)\left\{ \sum_{k=1}^{N} [(t_{1,k} + t_{2,k})/2 - ref_k], \sum_{k=1}^{N} [(t_{2,k} + t_{3,k})/2 - ref_k], \ldots, \sum_{k=1}^{N} [(t_{M,k} + t_{M+1,k})/2 - ref_k] \right\} \quad (4)$$

where:
N=the number of measurement blocks;
M=the number of samples per block;
$t_{i,k}$=the starting time stamp for the ith sample measurement in the kth block;
$t_{i+1,k}$=the stop time stamp for the ith sample measurement in the kth block; and
$ref_k$=the time stamp for the arming edge.

In addition to averaging so that the time relationships between the blocks are properly accounted for, the time placement of the samples within the measurement block is also proper. The time-axis averaging relationship of the invention, as shown in equation (4) above, positions the measurement at the midpoint between the start and stop time stamp for the measurement, at $(t_{1,k}+t_{2,k})/2$. As FIG. 4 shows, all of the block updates of the average lie on the actual modulation line 301.

As further explanation, an example of the previously mentioned time-axis averaging relationship will be described in connection with FIG. 3. If the first two zero crossings, denoted as $t_0$ and $t_1$ of waveform 201 and $t_0$, and $t_1$, of waveform 203, are the first respective starting time stamp and stop time stamp for each waveform, then applying equation (4) results in the first time-axis average, $t_0$, for waveform 201 as being:

$$t_0 = (t_0 + t_1)/2$$

and the first time-axis average, $t_{0'}$, for waveform 203 as being:

$$t_{0'} = (t_{0'} + t_{1'})/2.$$

Accordingly, $t_0$ and $t_{0'}$, are the midpoints between the starting and stop time stamps for each associated waveform. In like manner, succeeding pairs of time stamps for each waveform are used for determining the other respective midpoints of the time averages.

Figure 1:
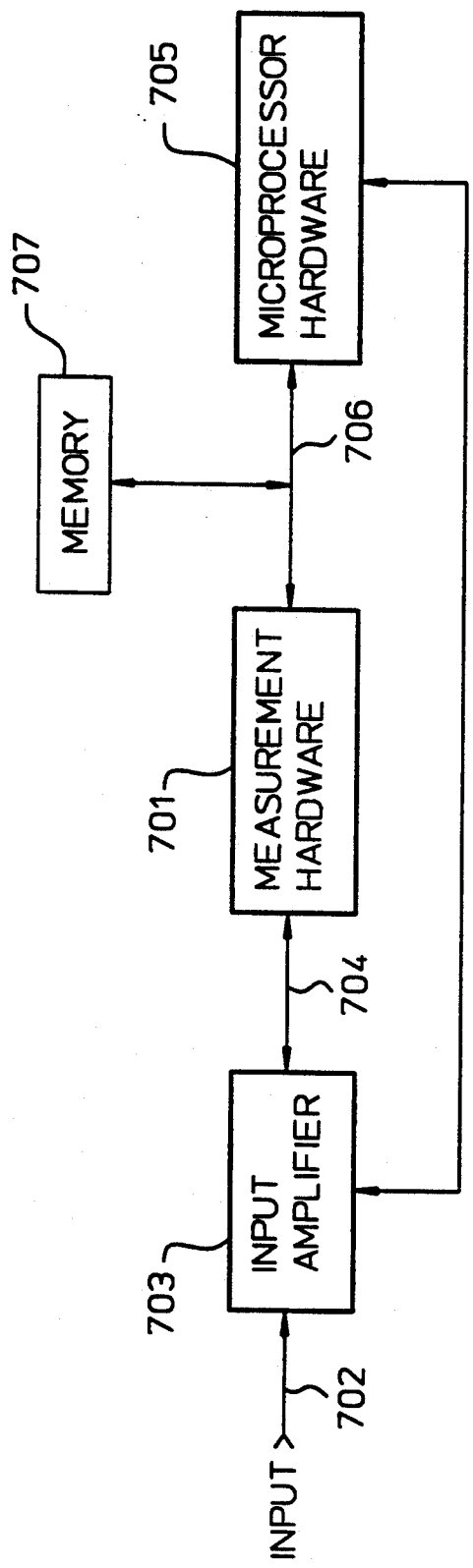
FIG. 1 shows a system block diagram of the instrument described by Stephenson, which is suitable for carrying out the measurement data averaging method of the invention.

The measurement data averaging method of the present invention can be carried out by any suitable processor, such as the microprocessor included in the instrument described by Stephenson. That is, the block averaging method of the present invention is one form of processing that the microprocessor 705 can perform on the raw binary measurement data stored by the measurement hardware 701 in the memory 707 shown in FIG. 1.

Figure 6:
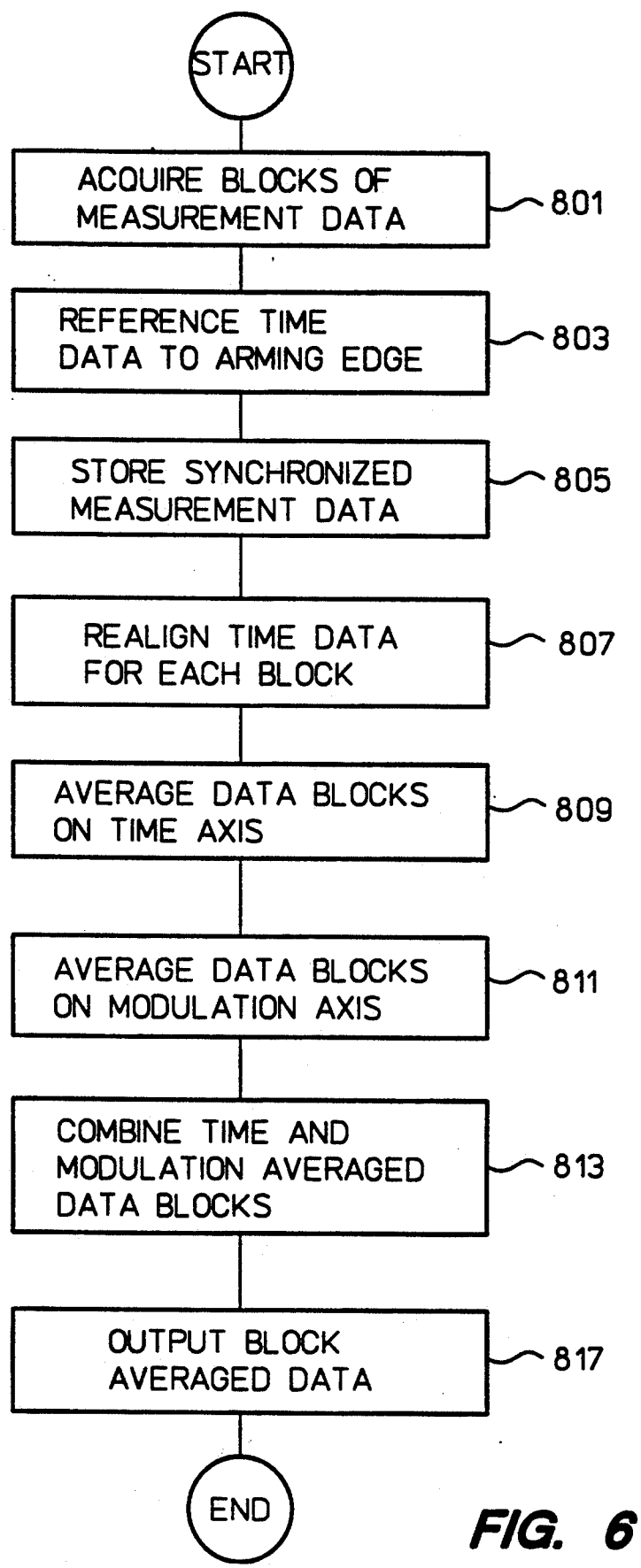
FIG. 6 shows a flow chart illustrating the programming steps to implement the measurement data averaging method of the invention.

FIG. 6 shows a flow chart illustrating the programming steps that microprocessor 705 performs to implement the measurement data averaging method of the invention. In step 801, the microprocessor 705 instructs the measurement hardware 701 to acquire blocks of measurement data. For example, for frequency modulation measurements of an input signal, this measurement data might comprise data for frequency and for the time at which each frequency datum was taken. In step 803, each block of measurement data is referenced to the synchronizing stimulus for that block, e.g., the time of the arming edge used to trigger the data acquisition for the measurement block. Then, in step 805, the synchronized measurement data for each block is stored in memory 707. Next, in step 807, the time data for each block of synchronized measurement data is re-aligned to the center of the time period in which the measurement datum was taken. In step 809, the time data for the blocks is averaged in the time axis. Steps 807 and 809 are performed by microprocessor 705 using the relationship of equation (4), above. Next, in step 811, the frequency data for the blocks is averaged in the frequency axis. Step 811 is performed by microprocessor 705 using the relationship of equation (3), above. In step 813, the averaged data from steps 809 and 811 is combined to produce a block of averaged measurements. Then, in step 817, the block of averaged data is output, for example, to a display, to a printing device or plotter, or to a memory.

Conventionally, the position of the time of occurrence of a processed result (such as frequency or period) is set at the time of the event which initiated that particular measurement. For example, in the frequency measurement on the first interval of the waveform shown in FIG. 2, the frequency value will be $1/(t_1-t_0)$ and the time at which this frequency is said to have occurred will be $t_0$, the time of the event that initiated the measurement.

In fact, placement of the measurement time at the starting event time causes two problems, the first of which is not only a problem for block averaging, but is a problem for all measurements which use a start and stop event to derive a result: the time relationships of the samples within a block are distorted; and this type of time placement, if used for a time stamp type measurement (one where the timing from the block arming edge to the first sample is measured) creates a misleading impression of when the frequency occurred (assuming it is a frequency measurement) with respect to the block arming edge.

To illustrate the problem of time distortion (which results in a distorted overall representation of the time variation result), consider again the linearly modulated signal shown in FIG. 2. Because the frequency of the input signal is linearly modulated, the instantaneous frequency increases during the period from $t_0$ to $t_1$ over which the measurement is made. The measurement reflects the average frequency for that period, higher than the frequency at $t_0$. Thus, placing this measurement on the time axis at time $t_0$ will produce an incorrect result. The error committed by aligning each result at the start boundary is a function of the frequency being measured. The higher the frequency, the closer the placement is to the correct time, and hence the smaller the error.

FIG. 7 illustrates the effect of time placement error for a linearly modulated input signal. Each of the three plots 501, 502, and 503 represents the first several negative zero crossings for an ideal linear frequency modulation signal. The phase is randomly varied on each block update, which allows the time of the zero crossings to move.

The uppermost plot 501 shows the result of aligning each measurement at the start time stamp for that measurement. Both of the problems discussed earlier are evident. Although the actual modulation was linear, this result is curved. This is due to the effect of greater error at lower frequencies. As the frequency increases, the result gets closer to the actual instantaneous frequency. The upper plot 501 exhibits an offset from the actual modulation (center plot). For this increasing frequency linear modulation, the offset means that this curve indicates that a given frequency was reached earlier than it actually was.

The lower plot 502 on FIG. 7 shows the result if each measurement is time-aligned to the stop time stamp (rather than the start event) for that measurement. Since the average frequency for each measurement occurred prior to the alignment time, and the frequency is always increasing, the plot always underestimates the instantaneous frequency and is distorted due to greater error at the lower frequencies.

The middle plot 503 on FIG. 7 shows the result of time-aligning each measurement in the center of the time interval during which the measurement was made $(t_i+t_{i+1})/2$ in accordance with the method of the invention. For measurements on a signal with linearly increasing frequency modulation as shown in FIG. 7, the plotted result 503 falls precisely upon the actual modulation. With this method the result is nearly distortion-free as long as the frequency change within the interval is near zero or no greater than first-order (linear). For measurements of signals with nonlinear modulation, this method for time alignment will not always be perfect, but given the fact that there is no knowledge of what the frequency is doing within the measurement interval (where only an average frequency measurement is made), it is better to align the measurement result at the center of the time interval for the measurement, rather than at the start or stop time of the measurement.

To further illustrate the operation of the averaging method of the invention, a signal with sinusoidal frequency modulation and the result of acquiring multiple time interval data block updates of this signal is shown in FIG. 8. The phase of each update was allowed to randomly vary, but the frequency modulation versus time was not, of course, allowed to vary.

The solid sinusoid 601 shown in FIG. 8 represents the true instantaneous frequency. As with the linear modulation example of FIG. 7, three positioning methods were used. For curve 603 the time of each measurement is positioned at the start of each sampling interval. For curve 605 the time of each measurement is positioned at the stop of each sampling interval. The offset error is obvious, but the distortion is subtle. If there were only offset error, the horizontal time to the true modulation would be constant throughout the waveform. But as indicated on FIG. 8 by segments A and B, the time is greater when the frequency is lower (A is longer than B). This is distortion of the same type that was described for the linear modulation examples.

The result which falls most nearly on the true modulation is curve 607, produced by the method of the invention, time-aligned to the center of each measurement interval. Unlike the linear modulation example, this example demonstrates the limitation for nonlinear frequency modulation. The distortion has several causes. In the region where the modulation frequency transitions from its lowest value to the center value, the rate of frequency change is non-linear such that it is accelerating throughout the sample interval. This means that an average frequency estimate of such an interval will be slightly overstated (too high) by placing the time at the center of the interval. In the region where the modulation frequency transitions from the center value to its highest value, the rate of frequency change is nonlinear such that it is decelerating throughout the sample interval, which will result in a slightly understated (too low) frequency estimate by placing the time at the center of the interval.

At the lowest modulation frequency (the bottom of the sine wave), the average frequency value is unable to get as low as the actual modulation frequency. This is because the actual low value is an instantaneous occurrence, while the average frequency measurements occur over finite intervals. The longer the measured interval, the more the average value will tend to pull away from the instantaneous value. Since the period is longer at the lowest modulation frequency than it is at the highest modulation frequency, there is more error at the low end. This can be seen on FIG. 8 where the measured frequency comes much closer to the true instantaneous frequency at the highest modulation frequency (shorter intervals) than it does at the lowest modulation frequency (longer intervals).

It will be understood that the embodiments of the present invention described above are susceptible to various modifications, changes, and adaptations. All is intended to be comprehended within the meaning and range of equivalents of the appended claims.

What is claimed is:

1. A method for operating a test instrument to acquire measurement data from dynamic, repeating modulated input signals, and to perform block averaging of the acquired measurement data to take into account the time variability of the measurement sampling, comprising the steps of:
   making measurements comprising time data and measurement data of the modulation of the signal between start and stop events, referenced to a synchronizing stimulus that is stable with respect to the modulation function being measured, to obtain blocks of measurement data;
   relating the time axis position of the time data for each block to the synchronizing stimulus to that block;
   for the data in each block, adjusting the time datum for each measurement datum to the center of the time period between the start and stop events;
   averaging the measurement data for a plurality of blocks in time to generate an array of time averages;
   averaging the measurement data for a plurality of blocks in modulation to generate an array of modulation averages;
   assembling the time and modulation averages into an array of ordered pairs to produce a block of averaged measurements; and
   providing an output signal representative of the block of averaged measurements.

2. The method of claim 1 wherein:
   the step of making measurements comprises acquiring time stamp data for the synchronizing stimulus, and for the start and stop event for each measurement.

3. The method of claim 2 wherein:
   the modulation averaging step is performed by using the relationship, $$(1/N)\left\{ \sum_{k=1}^{N} f(x_{1,k}), \sum_{k=1}^{N} f(x_{2,k}), \ldots, \sum_{k=1}^{N} f(x_{M,k}) \right\}$$

where:
   N = the number of measurement blocks;
   M = the number of samples per block; and
   $f(x_{i,k})$ = the measured value for the ith sample measurement in the kth block.

4. The method of claim 2 wherein:
   the time averaging step is performed by using the relationship, $$(1/N)\left\{ \sum_{k=1}^{N} [(t_{1,k} + t_{2,k})/2 - ref_k], \sum_{k=1}^{N} [(t_{2,k} + t_{3,k})/2 - ref_k], \ldots, \sum_{k=1}^{N} [(t_{M,k} + t_{M+1,k})/2 - ref_k] \right\}$$

where:
   N = the number of measurement blocks;
   M = the number of samples per block;
   $t_{i,k}$ = the starting time stamp for the ith sample measurement in the kth block;
   $t_{i+1,k}$ = the stop time stamp for the ith sample measurement in the kth block; and
   $ref_k$ = the time stamp for the arming edge.

5. A test instrument to acquire measurement data from dynamic, repeating modulated input signals, and to perform block averaging of the acquired measurement data to take into account the time variability of the measurement sampling, comprising:
   means for making measurements comprising time data and measurement data of the modulation on the signal between start and stop events, referenced to a synchronizing stimulus that is stable with respect to the modulation function being measured, to obtain blocks of measurement data;
   means for relating the time axis position of the time data for each block to the synchronizing stimulus to that block;
   for the data in each block, means for adjusting the time datum for each measurement to the center of the time period between the start and stop events;
   means for averaging the measurement data for a plurality of blocks in time to generate an array of time averages;
   means for averaging the measurement data for a plurality of blocks in modulation to generate an array of modulation averages;
   means for assembling the time and modulation averages into an array of ordered pairs to produce a block of averaged measurements; and
   means for providing an output signal representative of the block of averaged measurements.

6. The apparatus of claim 5 wherein:

the means for making measurements comprises means for acquiring time stamp data for the synchronizing stimulus, and for the start and stop event for each measurement.

7. The apparatus of claim 6 wherein:
the modulation averaging is performed by using the relationship, $$(1/N)\left\{\sum_{k=1}^{N} f(x_{1,k}), \sum_{k=1}^{N} f(x_{2,k}), \ldots, \sum_{k=1}^{N} f(x_{M,k})\right\}$$

where:
N = the number of measurement blocks;
M = the number of samples per block; and
$f(x_{i,k})$ = the measured value for the ith sample measurement in the kth block.

8. The apparatus of claim 6 wherein: the time averaging is performed by using the relationship, $$(1/N)\left\{\sum_{k=1}^{N} [(t_{1,k} + t_{2,k})/2 - ref_k], \sum_{k=1}^{N} [(t_{2,k} + t_{3,k})/2 - ref_k], \ldots, \sum_{k=1}^{N} [(t_{M,k} + t_{M+1,k})/2 - ref_k]\right\}$$

where:
N = the number of measurement blocks;
M = the number of samples per block;
$t_{i,k}$ = the starting time stamp for the ith sample measurement in the kth block.
$t_{i+1,k}$ = the stop time stamp for the ith sample measurement in the kth block; and
$ref_k$ = the time stamp for the arming edge.

* * * * *